United States Patent
Twohy

(10) Patent No.: US 9,557,098 B2
(45) Date of Patent: Jan. 31, 2017

(54) MERCHANDISER INCLUDING POWER-GENERATING THERMAL RECOVERY SYSTEM

(71) Applicant: Hussmann Corporation, Bridgeton, MO (US)

(72) Inventor: Raymond P. Twohy, Saint Peters, MO (US)

(73) Assignee: Hussmann Corporation, Bridgeton, MO (US)

( * ) Notice: Subject to any disclaimer, the term of this patent is extended or adjusted under 35 U.S.C. 154(b) by 333 days.

(21) Appl. No.: 14/168,996

(22) Filed: Jan. 30, 2014

(65) Prior Publication Data
US 2015/0208827 A1    Jul. 30, 2015

(51) Int. Cl.
| | |
|---|---|
| *F25B 21/00* | (2006.01) |
| *F25B 21/02* | (2006.01) |
| *F25D 27/00* | (2006.01) |
| *A47F 3/04* | (2006.01) |
| *H01L 35/30* | (2006.01) |

(52) U.S. Cl.
CPC ............. *F25D 27/00* (2013.01); *A47F 3/0404* (2013.01); *A47F 3/0426* (2013.01); *H01L 35/30* (2013.01)

(58) Field of Classification Search
CPC ....... F25B 21/00; F25B 21/02; F25B 2321/02; F25B 2321/025; F25B 2321/0251; F25D 2400/06; A47F 3/0404; A47F 3/0452; A47F 3/043; A47F 3/0434
See application file for complete search history.

(56) References Cited

U.S. PATENT DOCUMENTS

| | | |
|---|---|---|
| 7,510,303 B2 | 3/2009 | Jonsson et al. |
| 7,812,246 B2 | 10/2010 | Kondoh |
| 7,824,056 B2 | 11/2010 | Madireddi et al. |
| 7,954,979 B2 | 6/2011 | Sommers et al. |

(Continued)

FOREIGN PATENT DOCUMENTS

| | | |
|---|---|---|
| CN | 102392968 | 3/2012 |
| JP | 2002195720 | 7/2002 |

OTHER PUBLICATIONS

Search Report of the International Searching Authority for Application No. PCT/US2015/010024 dated Apr. 20, 2015 (5 pages).

(Continued)

*Primary Examiner* — Ryan J Walters
*Assistant Examiner* — Erik Mendoza-Wilkenfe
(74) *Attorney, Agent, or Firm* — Michael Best & Friedrich LLP

(57) ABSTRACT

A refrigerated merchandiser including a case defining a product display area to support product and a refrigeration system at least partially coupled to the case to condition the product display area. The case includes case structure at least partially exposed to the product display area. The merchandiser also includes a heat guide that is in communication with cold air within the product display area, and a heat source that is coupled to the case structure within the product display area. The heat source is further coupled to the heat guide by a thermal recovery device. The heat guide forms a bridge between the thermal recovery device and the cold air in the product display area such that power is generated based on a temperature difference across the thermal recovery device.

17 Claims, 3 Drawing Sheets

(56) References Cited

U.S. PATENT DOCUMENTS

| | | |
|---|---|---|
| 8,421,403 B2 | 4/2013 | Newman |
| 2004/0226599 A1 | 11/2004 | Kondoh |
| 2006/0016469 A1 | 1/2006 | Kondoh |
| 2008/0165526 A1* | 7/2008 | Saraiji .................. A47F 3/001 362/125 |
| 2008/0186695 A1 | 8/2008 | Awai et al. |
| 2010/0097780 A1* | 4/2010 | Beatenbough .......... A47F 3/001 362/92 |
| 2010/0207573 A1* | 8/2010 | Mo ...................... F21V 29/763 320/101 |
| 2012/0081066 A1 | 4/2012 | Newman |
| 2013/0061901 A1 | 3/2013 | Tohei et al. |

OTHER PUBLICATIONS

Written Opinion of the International Searching Authority for Application No. PCT/US2015/010024 date Apr. 20, 2015 (9 pages).
Nextreme Thermal Solutions, ETG HV37 Power Generator; 2012 Webpage.

* cited by examiner

US 9,557,098 B2

MERCHANDISER INCLUDING POWER-GENERATING THERMAL RECOVERY SYSTEM

BACKGROUND

The present invention relates to a refrigerated merchandiser, and more particularly, to a refrigerated merchandiser including a light assembly and a thermal recovery device that generates power based on a temperature difference associated with the light assembly.

Conventional light assemblies generally include a frame or bracket that attach to a portion of a merchandiser (e.g., shelf, mullion, canopy) and that support a light (e.g., LEDs) for illuminating a display area of the merchandiser. Existing light fixtures are often secured to the merchandiser using a magnet or a fastener (e.g., screw or bolt).

SUMMARY

In one construction, the invention provides a refrigerated merchandiser including a case defining a product display area to support product and a refrigeration system at least partially coupled to the case to condition the product display area. The case includes case structure at least partially exposed to the product display area. The merchandiser also includes a heat guide that is in communication with cold air within the product display area, and a heat source that is coupled to the case structure within the product display area. The heat source is further coupled to the heat guide by a thermal recovery device. The heat guide forms a bridge between the thermal recovery device and the cold air in the product display area such that power is generated based on a temperature difference across the thermal recovery device.

In another construction, the invention provides a refrigerated merchandiser including a case defining a product display area to support product, and a refrigeration system at least partially coupled to the case to refrigerate the product display area. The case includes a case frame that has at least one mullion defining an opening to provide access to the product display area. The merchandiser also includes a light assembly coupled to the mullion and positioned to at least partially illuminate the product display area. The light assembly includes a light emitting diode ("LED"), a heat guide in communication with cold air within the product display area, and a thermal recovery device positioned between the LED and the heat guide to generate power based on a temperature difference between the LED and the heat guide. The generated power at least partially powers one or more components of the merchandiser.

In another construction, the invention provides a refrigerated merchandiser including a case defining a product display area to support product and a refrigeration system at least partially coupled to the case to condition the product display area. The case includes case structure at least partially exposed to the product display area. The merchandiser also includes a heat guide that is in communication with cold air within the product display area, and a light assembly that is coupled to the case structure and that has an LED positioned to at least partially illuminate the product display area. The merchandiser also includes a thermal recovery device positioned between the light assembly and heat guide. The thermal recovery device generates power based on a temperature difference between the LED and the heat guide to at least partially power the LED.

Other aspects of the invention will become apparent by consideration of the detailed description and accompanying drawings.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

DETAILED DESCRIPTION

Figure 1:
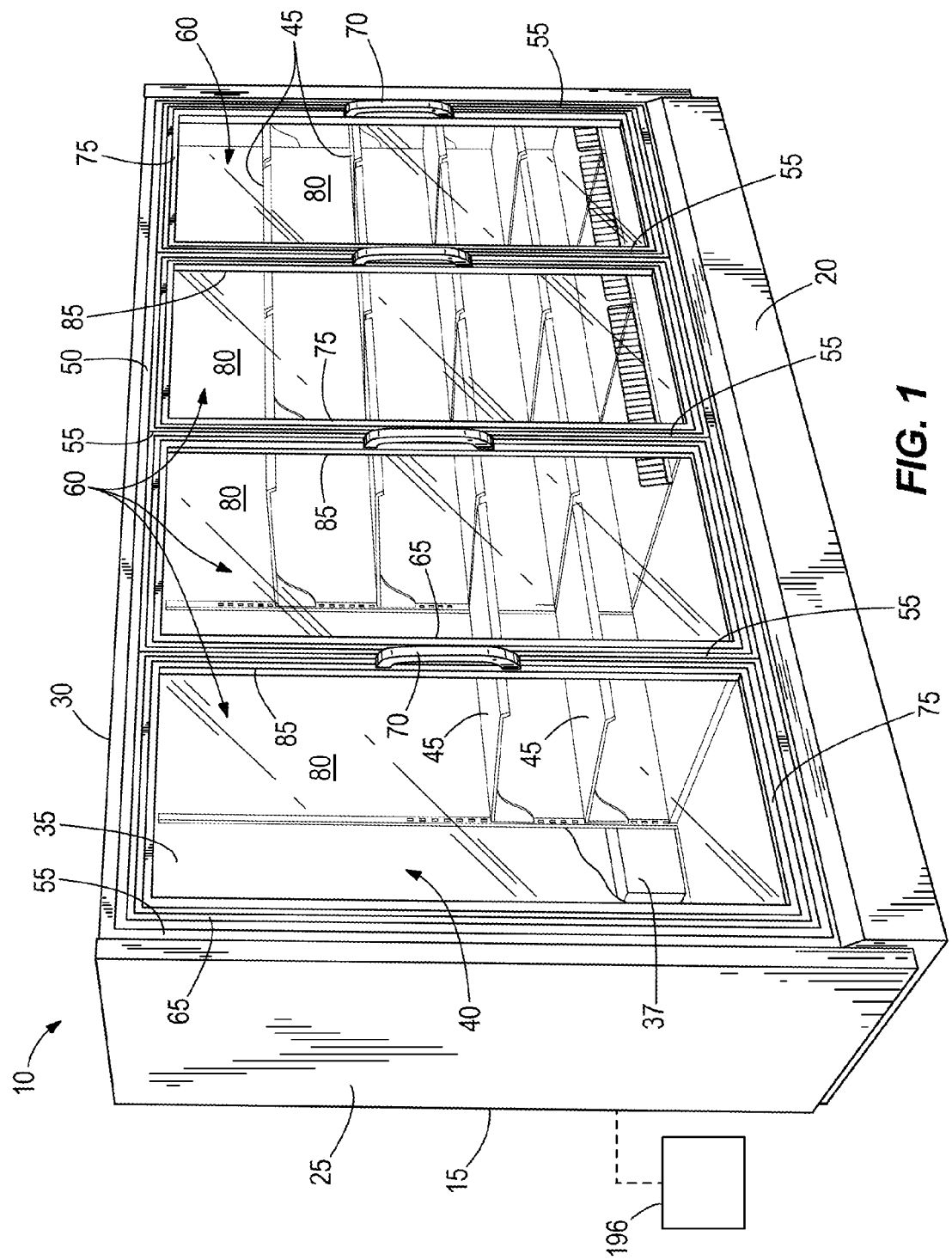
FIG. 1 is a perspective view of a merchandiser embodying the invention.

FIG. 1 shows a merchandiser 10 that displays product (e.g., frozen food, fresh food, beverages, non-food product, etc.) available to consumers in a retail setting (e.g., a supermarket or grocery store). The merchandiser 10 includes a case 15 that has a base 20, side walls 25, a case top or canopy 30, and a rear wall 35. A refrigeration system 37 (not shown in its entirety) is coupled to and at least partially located within the case 15 to refrigerate the product. The base 20, the side walls 25, the case top 30, and the rear wall 35 cooperatively define a product display area 40. Shelves 45 are coupled to the rear wall 35 and support product within the product display area 40.

As illustrated, the case 15 includes a frame 50 adjacent a front of the merchandiser 10. FIG. 1 shows that the frame 50 includes vertical mullions 55 that define openings 60 to the product display area 40. The mullions 55 are spaced horizontally along the case 15 to provide structural support to the case 15. Each mullion 55 is defined by a structural member that can be formed from a non-metallic or metallic material. Doors 65 are coupled to the frame 50 and positioned over the openings 60 to provide selective access to the product display area 40 through the openings 60. A handle 70 is positioned adjacent an edge of each door 65 to move the door 65 between an open position and a closed position (e.g., via a hinge 75). Each door 65 includes a frame 77 and a glass member 80 that is secured to each door 60 by the respective door frame 77 to allow viewing of product from outside the case 15. In some constructions, the merchandiser 10 can be provided without doors (e.g., the merchandiser 10 can be an open-front merchandiser).

In general, the case top 30, the shelves 45, and the mullions 55, as well as other parts of the case 15, define case structure that can support one or more light assemblies 100. Although the light assemblies 100 are described in detail below as being attached to the mullions 55, it will be appreciated that the light assemblies 100 can be attached to other case structure. Each light assembly 100 includes a light fixture or housing or base 104 ("referred to as the "base 104" for purposes of description) and a light source 108. The base 104 is non-metallic and acts as an insulator that can be integrally formed with the mullion 55, or separately coupled to the mullion 55.

The illustrated base 104 is hollow and supports the light source 108, a heat guide 112, and a lens 116. More specifically, the base 104 has a projection 120 extending outward from the mullion 55 (e.g., perpendicular to the mullion 55) and the remainder of the base 104, and a lateral extension 124 extending in a direction generally perpendicular to the projection 120 (across the mullion 55). The projection 120 has a first cavity 126 on a distal end of the projection 120, and a second cavity 128 disposed on a side of the projection 120 (e.g., adjacent or at the juncture between the projection 120 and the lateral extension 124). The projection 120 also has a flexible arm 132 that extends toward the lateral extension 124 (generally downward as viewed in FIG. 2) and that encloses part of the second cavity 128. The lateral extension 124 defines a first retainer channel 136 and a second retainer channel 140 disposed outward of the first retainer channel 136. That is, the second retainer channel 140 is located adjacent an outer edge of the extension 124, and the first retainer channel 136 is located between the projection 120 and the second retainer channel 140.

The light source 108 includes a printed circuit board ("board") 140 and one or more light emitting diodes ("LEDs") 144 or other solid state devices that can illuminate the product display area 40. As illustrated, the board 140 has a length and a width, and one longitudinal edge of the board 140 (one of the edges defining the width) is coupled to the base 104 within the first retainer channel 136. The LEDs 144 are spaced along the length of the board 140 at desired intervals to project light into the product display area 40. The illustrated LEDs 144 are centered across the width of the board 140 and are oriented at an angle (e.g., 30-75 degrees) relative to a plane defined by a surface of the glass 80.

The heat guide 112 is attached to the base 104 and is shaped to be supported on the base 104 and to partially support the light source 108 and the lens 116. The heat guide 112 is formed of a heat-conductive material (e.g., metal, metal composite, etc.) and is exposed to or positioned in communication with cold air in the product display area 40.

Figure 2:
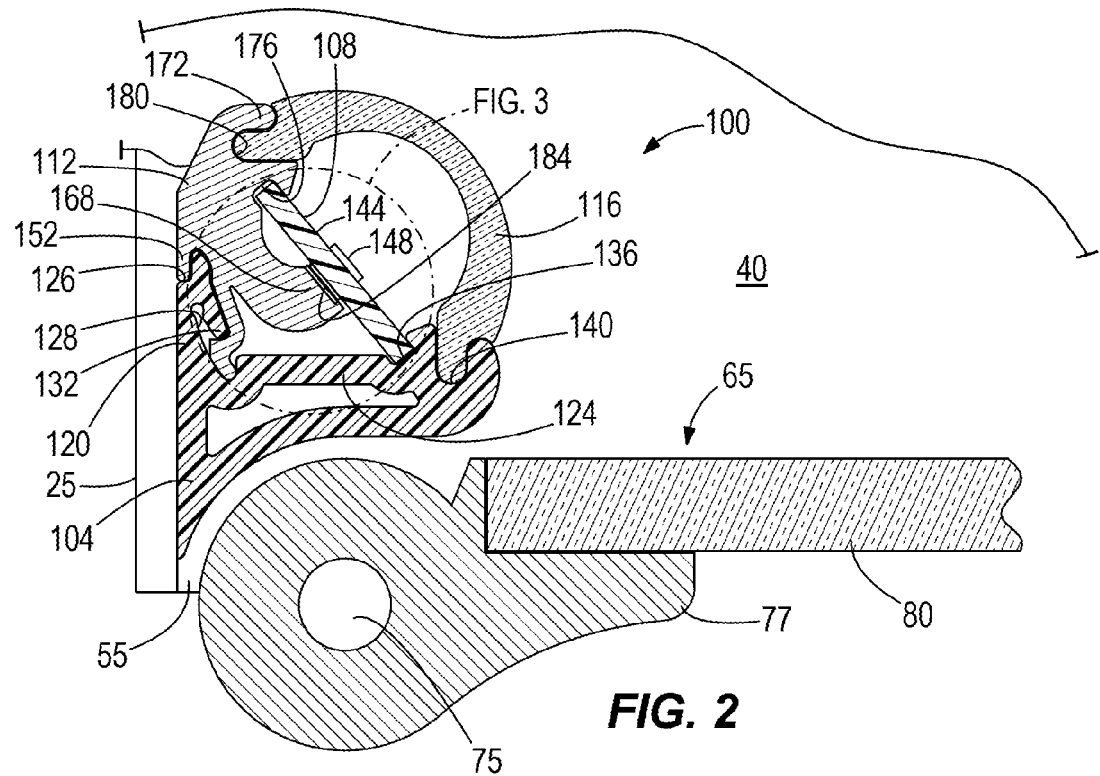
FIG. 2 is a cross-section view of a portion of the merchandiser and a light assembly embodying the invention.

With continued reference to FIG. 2, the heat guide 112 has a first support 152 and a second support 156 spaced apart from the first support 152 to define a slot 160. The first support 152 defines one wall of the slot 160 and is coupled to the projection 120 within the first cavity 126. The second support 156 defines another wall of the slot 160 generally opposite the first wall and is coupled to the projection 120 within the second cavity 128. When the heat guide 112 is attached to the base 104, the flexible arm 132 is positioned in the slot 160 and held in place by the first and second supports 152, 156. A corner or ridge 164 defined on the second support 156 and the distal end of the flexible arm 132 cooperatively define a snap feature or snap-fit engagement that retains the heat guide 112 on the base 104 until it is desired that the heat guide 112 be removed.

The heat guide 112 also has a support arm 168 that extends from the main body of the heat guide 112, and a lens support 172 disposed on an outer end of the heat guide 112. The support arm 168 is curved and defines a pedestal that supports the light source 108. A board slot 176 is disposed in the heat guide 112 adjacent (below, as viewed FIG. 2) the lens support 172 to support the other longitudinal edge of the board 144. The lens support 172 defines a channel 180 to support an edge of the lens 116.

The lens 116 is curved and has one edge coupled to the extension 124 within the second retainer channel 140 and another edge that is coupled to the lens support 172 within the channel 180. As illustrated, the edges of the lens 116, the extension 124, and the lens support 172 cooperatively engage each other to retain the lens 116 in place. The lens 116 and/or the extension 124 can flex to facilitate attachment of the lens 116 to the heat guide 112 and the extension 124. In general, the lens 116 protects the light source 108 from debris and moisture, and can refract or diffuse light emanating from the LEDs 148.

Figure 3:
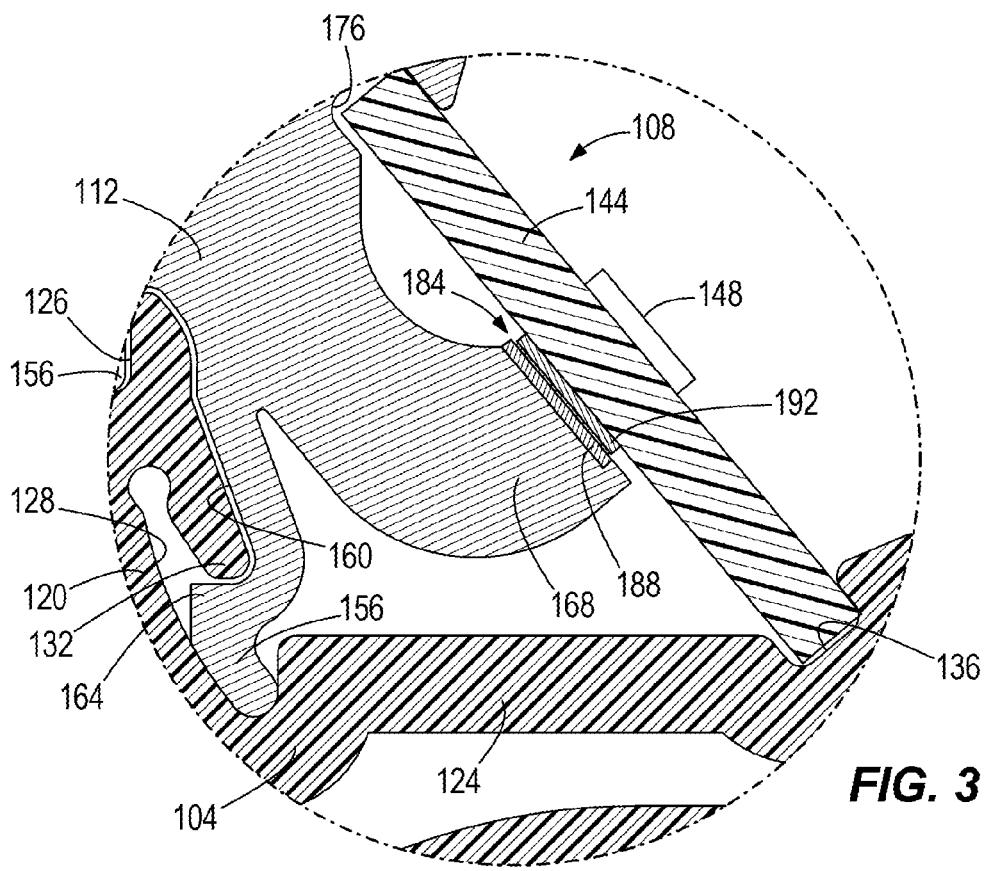
FIG. 3 is an enlarged view of the light assembly of FIG. 2 illustrating a thermal recovery device.

With reference to FIG. 3, the light assembly 100 also includes a thermal recovery device 184 that is positioned between the light source 108 and the heat guide 112. As illustrated, the heat guide 112 forms a bridge between the thermal recovery device 184 and cold air in the product display area 40. The illustrated thermal recovery device 184 is a thermo-electric generator that generates power based on a temperature difference between the heat guide 112 and the board 144. More specifically, the thermal recovery device 184 has a first portion 188 that is embedded in the heat guide 112, and a second portion 192 that is coupled to the underside of the board 144. The thermal recovery device 184 uses the Seebeck effect to generate power from the difference in temperature between the first portion 188 and the second portion 192.

Although the heat guide 112 is described in detail with regard to the shape illustrated in FIGS. 2 and 3, it should be appreciated that the heat guide 112 can have other shapes as long as the heat guide 112 forms a bridge between cold air in the product display area 40 and the thermal recovery device 184 such that power can be generated based on the temperature difference between the light source 108 and the heat guide 112.

Figure 4:
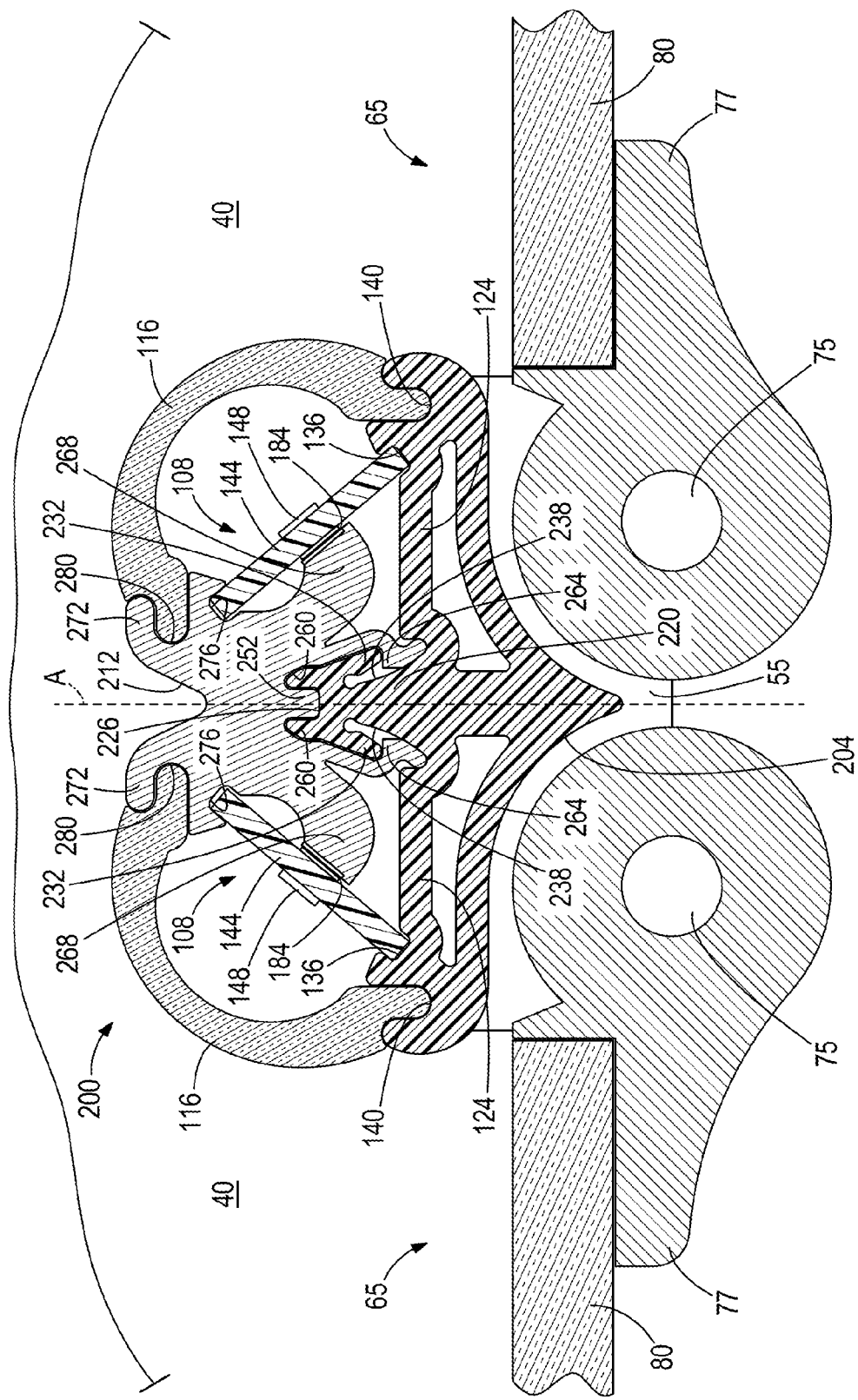
FIG. 4 is a cross-section view of a portion of the merchandiser and another light assembly embodying the invention.

FIG. 4 illustrates another light assembly 200 for use in the merchandiser 10. In particular, the light assembly 200 is placed in the merchandiser 10 on mullions 55 that are located between adjacent doors 65, whereas the light assembly 100 is placed in the merchandiser 10 at corner mullions 55. The illustrated light assembly 200 is similar to the light assembly 100 and like elements are given the same reference numerals.

With reference to FIG. 4, the illustrated light assembly 200 includes two light sources 108 and a light fixture or housing or base 204 ("referred to as the "base 204" for purposes of description). The base 204 is non-metallic and acts as an insulator that can be integrally formed with the mullion 55, or separately coupled to the mullion 55.

The illustrated base 204 is hollow and supports the light sources 108, a heat guide 212, and lenses 116 disposed over the light sources 108. More specifically, the base 204 centered on the mullion 55 and is symmetrical about a plane A that is perpendicular to the surface of the glass 80 (and illustrated as generally perpendicular to the mullion 55). The base 204 has a projection 220 extending outward from the mullion 55, and lateral extensions 224 extending away from each other in a direction generally perpendicular to the projection 220 (across the mullion 55). The projection 220 has a first cavity 226 on a distal end of the projection 220, and opposed second cavities 228 disposed on the sides of the projection 220 (e.g., adjacent or at the junctures between the projection 220 and the lateral extensions 224). The projection 220 also has flexible arms 232 that extend toward the lateral extensions 224 (generally downward as viewed in FIG. 4) and that encloses part of the second cavities 228. Each lateral extension 224 has the first retainer channel 136 and the second retainer channel 140.

The heat guide 212 is attached to the base 204 and is shaped to be supported on the base 204 and to partially support the light sources 108 and the lenses 116. The heat guide 212 is formed of a heat-conductive material (e.g., metal, metal composite, etc.) and is exposed to or positioned in communication with cold air in the product display area 40.

With continued reference to FIG. 4, the heat guide 212 is symmetrical about the plane A, and therefore has a first support 252 and symmetrical second supports 256 spaced apart from the first support 252 to define slots 260. The first support 252 defines one wall of the corresponding slot 260 and is coupled to the projection 220 within the first cavity 226. The second support 256 defines another wall of the slot 260 generally opposite the first wall and is coupled to the projection 220 within the second cavity 228. When the heat guide 212 is attached to the base 204, the flexible arm 232 is positioned in the slot 260 and held in place by the first and second supports 252, 256. A corner or ridge 264 defined on each second support 256 and the distal end of the corresponding flexible arm 232 cooperatively define a snap feature or snap-fit engagement that retains the heat guide 212 on the base 204 until it is desired that the heat guide 212 be removed.

The heat guide 212 also has support arms 268 that extend from the main body of the heat guide 212, and lens supports 272 disposed on an outer end of the heat guide 212. A board slot 276 is disposed in the heat guide 212 adjacent (below, as viewed FIG. 4) the lens support 272 to support the other longitudinal edge of the board 144. Each support arm 268 is curved and defines a pedestal that supports the light source 108. Each lens support 272 defines a channel 280 to support an edge of the lens 116. As illustrated, the edges of the lenses 116, the extensions 224, and the lens supports 272 cooperatively engage each other to retain the respective lenses 116 in place. The lenses 116 protect the light source 108 from debris and moisture, and can refract or diffuse light emanating from the LEDs 148.

The light assembly 200 also includes thermal recovery devices 184 that are positioned between the respective light sources 108 and the heat guide 212. As illustrated, the heat guide 212 forms a bridge between the thermal recovery device 184 and cold air in the product display area 40. The illustrated thermal recovery device 184 is a thermo-electric generator that generates power based on a temperature difference between the board 144 and the heat guide 212.

Although the heat guide 212 is described in detail with regard to the shape illustrated in FIG. 4, it should be appreciated that the heat guide 212 can have other shapes as long as the heat guide 212 forms a bridge between cold air in the product display area 40 and the thermal recovery device 184 such that power can be generated based on the temperature difference between the light source 108 and the heat guide 212.

In operation, the thermal recovery device 184 measures the temperature difference between the heat guide 112 and the light source 108. Because the heat guide 112 is exposed to the cold air in the product display area 40 and conducts heat, the temperature of the heat guide 112 adjacent the first portion 188 is approximately the same as the temperature of the cold air. Heat generated by the LEDs 148 is dissipated at least partially through the board 144. As such, the second portion 192 is heated to a temperature above the temperature of the air in the product display area 40. In some constructions, the temperature of the second portion 192 can be approximately the same as the board 144.

The first portion 188 measures a temperature of the heat guide 112, and the second portion 192 measures a temperature of the light source 108 at the underside of the board 144. In general, the product display area 40 is refrigerated to an air temperature between approximately −35° C. and 10° C., (i.e. approximately 238K to 283K), although other temperature ranges are possible and considered herein. Due to the heat generated by the LEDs 148, the second portion 192 is heated such that a temperature difference of at least approximately 30° C. exists across the thermal recovery device 184.

The thermal recovery device 184 recovers waste heat from light source 108 and generates electricity or power from the waste heat to power one or more components of the merchandiser 10. More specifically, the thermal recovery device 184 converts the temperature difference between the light source 108 and the heat guide 112 to electrical energy that can be stored in a storage device 196 (e.g., a battery or battery pack) or directed to components needing immediate power. Generally, the electrical power can be recycled to lower the power consumption of the merchandiser 10, and may be stored and used to power other electrical systems or devices. For example, the power generated by the thermal recovery device 184 can be used to at least partially power the light source 108.

For example, at a measured temperature difference of approximately 10° C. (i.e., 10K) across the thermal recovery device 184, the thermal recovery device 184 can output approximately 1.0 mW of power and an open circuit voltage of approximately 170 mV. As another example, at a measured temperature difference of approximately 50° C. (i.e., 50K) the thermal recovery device 184 can output approximately 24 mW of power and an open circuit voltage of approximately 850 mV. Preferably, the measured temperature difference is at least 30° C. (i.e., 30K) such that the thermal recovery device 184 can output approximately 9 mW of power and an open circuit voltage of approximately 500 mV. While the 30° C. temperature difference has a magnitude that generates power that can be used or stored, a smaller magnitude temperature difference (e.g., 10° C. or 10K) can generate adequate power to at least partially provide electrical energy to the merchandiser 10. One exemplary thermal recovery device 184 is Nextreme's ETEG HV37 power generator, which is manufactured by Nextreme Thermal Solutions. This power generator has a range between approximately 10° C. and 100° C. (i.e., 10K to 100K), and is capable of outputting power in the range of approximately 1.0 mW to 90 mW and an open circuit voltage in the range of approximately 175 mV to 1700 mV.

The light sources 108 define exemplary heat sources positioned in the product display area 40 that can be used to generate electrical power based on the temperature differential between the heat source and cold air in the product display area 40. By positioning the power recovery device 184 between the heat source and the cold air, waste heat from the heat source can be recycled or converted to useful electrical energy. In the exemplary light assemblies 100, 200 described with regard to FIGS. 2-4, the LEDs may produce as much as 80% waste heat during operation (resulting in an external temperature of approximately 50° C.). By connecting the hot junction (i.e. the second portion 192) of the thermal recovery device 184 to the cold junction (i.e. the first portion 188), a temperature difference (e.g., 30° C.) across the device 184, with minimal losses, can be sustained to at least partially power the light sources 108 and/or other components of the merchandiser 10 directly or via the storage device 196.

Various features and advantages of the invention are set forth in the following claims.

The invention claimed is:

1. A refrigerated merchandiser comprising:
a case defining a product display area to support product, the case including case structure at least partially exposed to the product display area;
a refrigeration system at least partially coupled to the case to condition the product display area;
a heat source including a base coupled to the case structure within the product display area;
a heat guide supported by and extending outward from the base, the heat guide positioned to be directly exposed to and in communication with cold air within the product display area; and
wherein the heat source is further coupled to the heat guide by a thermal recovery device,
wherein the heat guide is directly coupled to the thermal recovery device and forms a structural bridge between the thermal recovery device and the cold air in the product display area such that power is generated based on a temperature difference across the thermal recovery device.

2. The refrigerated merchandiser of claim 1, wherein the case structure includes one of a shelf and a mullion, the mullion defining an opening to provide access to the product display area.

3. The refrigerated merchandiser of claim 1, wherein the heat source includes a light assembly coupled to the case structure and positioned to at least partially illuminate the product display area.

4. The refrigerated merchandiser of claim 1, wherein the thermal recovery device includes a thermo-electric generator configured to generate power based on the temperature difference across the thermo-electric generator.

5. The refrigerated merchandiser of claim 1, wherein the thermal recovery device is positioned between the heat source and the heat guide.

6. The refrigerated merchandiser of claim 5, wherein the thermal recovery device is in electrical communication with the merchandiser to at least partially power one or more electrical components disposed within the case.

7. The refrigerated merchandiser of claim 6, wherein the heat source includes an LED light assembly, and wherein the thermal recovery device is in electrical communication with the LED light assembly to least partially power the LED light assembly.

8. The refrigerated merchandiser of claim 1, wherein the base is an insulator.

9. A refrigerated merchandiser comprising:
a case defining a product display area to support product, the case including a case frame having at least one mullion defining an opening to provide access to the product display area;
a refrigeration system at least partially coupled to the case to refrigerate the product display area; and
a light assembly coupled to the mullion and positioned to at least partially illuminate the product display area, the light assembly including
an LED including a base coupled to the mullion within the product display area,
a heat guide coupled to and extending outward from the base, the heat guide positioned to be directly exposed to and in communication with cold air within the product display area, and
a thermal recovery device positioned between the LED and the heat guide to generate power based on a temperature difference between the LED and the heat guide,
wherein the heat guide is directly coupled to the thermal recovery device, and
wherein the generated power at least partially powers one or more components of the merchandiser.

10. The refrigerated merchandiser of claim 9, wherein the base supports the heat guide, the LED, and a lens of the light assembly.

11. The refrigerated merchandiser of claim 9, wherein the base acts as an insulator between the mullion and the heat guide.

12. The refrigerated merchandiser of claim 9, wherein the light assembly includes a circuit board, and wherein the thermal recovery device is coupled to the circuit board on a surface opposite a surface of the circuit board to which the LED is attached.

13. The refrigerated merchandiser of claim 9, wherein the thermal recovery device includes a thermo-electric generator.

14. A refrigerated merchandiser comprising:
a case defining a product display area to support product, the case including case structure at least partially exposed to the product display area;
a refrigeration system at least partially coupled to the case to condition the product display area;
a light assembly including a base coupled to the case structure within the product display area and including an LED positioned to at least partially illuminate the product display area;
a heat guide supported by and extending outward from the base, the heat guide positioned to be directly exposed to and in communication with cold air within the product display area;
and
a thermal recovery device positioned between the light assembly and the heat guide, the thermal recovery device directly coupled to the heat guide and configured to generate power based on a temperature difference between the LED and the heat guide to at least partially power the LED.

15. The refrigerated merchandiser of claim 14, wherein the heat guide forms a structural bridge between the thermal recovery device and the cold air in the product display area.

16. The refrigerated merchandiser of claim 14, wherein the case structure includes one of a shelf and a mullion, the mullion defining an opening to provide access to the product display area.

17. The refrigerated merchandiser of claim 14, wherein the base supports the heat guide, the LED, and a lens of the light assembly.

* * * * *